(12) United States Patent
Kouketsu et al.

(10) Patent No.: US 10,873,091 B2
(45) Date of Patent: Dec. 22, 2020

(54) METHOD FOR PRODUCING POROUS METAL BODY AND METHOD FOR PRODUCING ELECTRODE CATALYST

(71) Applicant: HONDA MOTOR CO., LTD., Tokyo (JP)

(72) Inventors: Seiichi Kouketsu, Tochigi-ken (JP); Kei Matsumoto, Tochigi-ken (JP); Yu Wakakuwa, Tochigi-ken (JP)

(73) Assignee: HONDA MOTOR CO., LTD., Tokyo (JP)

( * ) Notice: Subject to any disclaimer, the term of this patent is extended or adjusted under 35 U.S.C. 154(b) by 36 days.

(21) Appl. No.: 16/311,733

(22) PCT Filed: Mar. 28, 2017

(86) PCT No.: PCT/JP2017/012509
§ 371 (c)(1),
(2) Date: Dec. 20, 2018

(87) PCT Pub. No.: WO2017/221500
PCT Pub. Date: Dec. 28, 2017

(65) Prior Publication Data
US 2019/0198884 A1    Jun. 27, 2019

(30) Foreign Application Priority Data

Jun. 23, 2016    (JP) .................................. 2016-124145

(51) Int. Cl.
*H01M 4/86* (2006.01)
*C22C 1/08* (2006.01)
(Continued)

(52) U.S. Cl.
CPC ......... *H01M 4/8621* (2013.01); *B22F 3/1121* (2013.01); *B22F 7/004* (2013.01);
(Continued)

(58) Field of Classification Search
CPC .... B01J 21/18; B01J 35/0033; B01J 37/0018; B01J 37/082; H01M 4/8621; H01M 4/86;
(Continued)

(56) References Cited

U.S. PATENT DOCUMENTS 3,663,303 A * 5/1972 Dietz .................. H01M 4/8842
502/101
5,141,825 A * 8/1992 Jensen ............... G01N 27/4075
29/623.5
(Continued)

FOREIGN PATENT DOCUMENTS

JP    63-076833    4/1988
JP    02-008398    * 1/1990 ............. C25D 15/02
(Continued)

OTHER PUBLICATIONS

International Search Report and Written Opinion for International Application No. PCT/JP2017/012509 dated Jun. 27, 2017, 11 pages.
(Continued)

*Primary Examiner* — Patricia L. Hailey
(74) *Attorney, Agent, or Firm* — Amin, Turocy & Watson, LLP

(57) ABSTRACT

The present invention is a method for producing a porous metal body or a method for producing an electrode catalyst, which is capable of simplifying the production process and improving the production efficiency by not requiring a step of immersion in an acid treatment solution. A method for producing a porous metal body according to the present invention comprises: a step for forming a metal resin-containing layer, which contains a metal and a resin that has a lower melting point than the metal, on a base; and a step for obtaining a porous metal body by subjecting the metal
(Continued)

resin-containing layer to a heat treatment, thereby sintering the metal and removing the resin from the metal resin-containing layer.

7 Claims, 5 Drawing Sheets

(51) Int. Cl.
| | |
|---|---|
| *H01M 4/88* | (2006.01) |
| *B22F 7/00* | (2006.01) |
| *B22F 7/08* | (2006.01) |
| *B22F 3/11* | (2006.01) |
| *H01M 8/10* | (2016.01) |
| *C23C 14/00* | (2006.01) |

(52) U.S. Cl.
CPC .................. *B22F 7/08* (2013.01); *C22C 1/08* (2013.01); *H01M 4/86* (2013.01); *H01M 4/88* (2013.01); *H01M 4/8807* (2013.01); *H01M 4/8875* (2013.01); *C23C 14/00* (2013.01); *H01M 8/10* (2013.01); *Y02P 70/50* (2015.11)

(58) Field of Classification Search
CPC .... H01M 4/88; H01M 4/8807; H01M 4/8875; H01M 8/10; B22F 3/1121; B22F 7/004; B22F 7/08; C22C 1/08; C23C 14/00; Y02P 70/56
USPC ........ 502/101, 300; 427/113, 115, 124, 125, 427/250, 385.5; 429/523, 534
See application file for complete search history.

(56) References Cited

U.S. PATENT DOCUMENTS

| | | | | |
|---|---|---|---|---|
| 5,395,705 | A * | 3/1995 | Door | H01M 4/8828 |
| | | | | 429/481 |
| 5,773,162 | A | 6/1998 | Surampudi et al. | |
| 2001/0003605 | A1* | 6/2001 | Honda | H01G 13/00 |
| | | | | 427/404 |
| 2001/0041283 | A1* | 11/2001 | Hitomi | H01M 4/8605 |
| | | | | 429/492 |
| 2005/0109617 | A1 | 5/2005 | Ono et al. | |
| 2006/0166811 | A1* | 7/2006 | Huang | B01J 21/18 |
| | | | | 502/101 |
| 2008/0230171 | A1 | 9/2008 | Mei et al. | |

FOREIGN PATENT DOCUMENTS

| | | | | |
|---|---|---|---|---|
| JP | 40-2008398 | * | 1/1990 | ............. C25D 15/02 |
| JP | 04-036409 | | 2/1992 | |
| JP | 2002-117864 | | 4/2002 | |
| JP | 2005-133114 | | 5/2005 | |
| JP | 2005-158355 | | 6/2005 | |
| JP | 2008-229514 | | 10/2008 | |

OTHER PUBLICATIONS

Japanese Office Action for Japanese Patent Application No. 2018-523332 dated Jul. 16, 2019.

* cited by examiner

METHOD FOR PRODUCING POROUS METAL BODY AND METHOD FOR PRODUCING ELECTRODE CATALYST

TECHNICAL FIELD

The present invention relates to a method for producing a porous metal body and a method for producing an electrode catalyst.

BACKGROUND ART

In an electrode catalyst for a solid polymer electrolyte fuel cell or the like, a metal catalyst is required to have a larger contact area with a fuel gas or an oxygen-containing gas to accelerate an electrochemical reaction. In view of increasing a surface area per weight of the metal catalyst, Japanese Laid-Open Patent Publication No. 2008-229514 proposes a method for producing a porous body of the metal catalyst (a porous metal body) as the electrode catalyst.

Specifically, in this method, a stack of metal catalyst layers and mixture layers is formed on a base by repeating sputtering or vapor deposition of the layers. Each mixture layer contains a carbon material and at least one M metal element selected from the group consisting of Sn, Al, Cu, and Zn. The pore diameter or the like of the metal catalyst layer is controlled, e.g., because the mixture layer acts to suppress particle growth in the metal catalyst layer. Then, the stack is subjected to an acid treatment. In the acid treatment, the stack is immersed in an acidic solution (an acid treatment solution) such as hydrochloric acid, whereby part or all of the M metal elements are dissolved in the solution and removed from the stack to produce the electrode catalyst of the porous metal body.

SUMMARY OF INVENTION

In order to obtain an electrode catalyst having a sufficient electrode performance or the like, in a case where the stack is immersed in the acid treatment solution as described above, it is necessary to prevent the components of the solution from remaining in the electrode catalyst. However, it is difficult to completely remove the components of the solution. Furthermore, after using the acid treatment solution, a waste liquid treatment must be carried out. Thus, the above method requires complicated processes for producing the electrode catalyst, and results in a decrease in manufacturing efficiency.

A principal object of the present invention is to provide a method for producing a porous metal body, which can omit an immersion treatment in an acid treatment solution, and therefore is capable of simplifying manufacturing process and improving manufacturing efficiency.

Another object of the present invention is to provide a method for producing an electrode catalyst, which can omit an immersion treatment in an acid treatment solution, and therefore is capable of simplifying manufacturing process and improving manufacturing efficiency.

According to an aspect of the present invention, there is provided a method for producing a porous metal body, comprising the steps of: forming a metal-resin-containing layer containing a metal and a resin on a base, a melting point of the resin being lower than that of the metal; and heat-treating the metal-resin-containing layer, thereby sintering the metal and removing the resin from the metal-resin-containing layer, to obtain the porous metal body.

In the porous metal body production method of the present invention, the metal-resin-containing layer, which contains the metal and the resin having the lower melting point, is heat-treated to sinter the metal as described above. In the heat treatment, the resin acts as a pore source for sintering the metal without densification, and is removed from the metal-resin-containing layer via heat decomposition or the like. Therefore, the resultant porous metal body has appropriate pores.

Thus, in the heat treatment of the metal-resin-containing layer, the resin can act as a pore-forming agent, and can be removed from the metal-resin-containing layer. Therefore, although a conventional method using the above-described M metal element or the like for controlling the pore diameter of the porous metal body requires the immersion treatment in the acid treatment solution, the method of the present invention is capable of producing the porous metal body without the immersion treatment. Consequently, in the method of the present invention, the porous metal body can be produced by the simple process easily and efficiently without a step of removing the acid treatment solution from the porous metal body, a step of treating the used solution as a waste liquid, etc.

In the porous metal body production method of the present invention, in the step of forming the metal-resin-containing layer, it is preferred that the metal-resin-containing layer is formed by stacking a metal layer containing the metal and a resin layer containing the resin. In this case, the resin can effectively act as the pore-forming agent, and the porous metal body having appropriate pores can be produced easily.

In the porous metal body production method of the present invention, in the step of forming the metal-resin-containing layer, it is preferred that the metal-resin-containing layer is formed by at least one of sputtering and vapor deposition. In this case, the metal-resin-containing layer can be formed easily and appropriately, so that the porous metal body having appropriate pores can be produced easily.

According to another aspect of the present invention, there is provided a method for producing an electrode catalyst, comprising the steps of: forming a metal-resin-containing layer containing a metal catalyst and a resin on a base, a melting point of the resin being lower than that of the metal catalyst; and heat-treating the metal-resin-containing layer, thereby sintering the metal catalyst and removing the resin from the metal-resin-containing layer, to obtain a porous electrode catalyst.

In the electrode catalyst production method of the present invention, the resin acts as a pore-forming agent in the metal-resin-containing layer, whereby the metal can be sintered without densification. The resin can be decomposed and removed from the metal-resin-containing layer by the heat treatment. Therefore, the porous electrode catalyst having appropriate pores can be produced by the simple process easily and efficiently without the immersion treatment in the acid treatment solution. Furthermore, in the thus-obtained electrode catalyst, a surface area per weight of the metal catalyst can be increased, and thereby requires only a small amount of the metal catalyst for achieving an excellent electrode performance.

In the electrode catalyst production method of the present invention, in the step of forming the metal-resin-containing layer, it is preferred that the metal-resin-containing layer is formed by stacking a metal layer containing the metal catalyst and a resin layer containing the resin. In this case, the resin can effectively act as the pore-forming agent, and the porous electrode catalyst having appropriate pores can be produced easily.

In the electrode catalyst production method of the present invention, in the step of forming the metal-resin-containing layer, it is preferred that the metal-resin-containing layer is formed by at least one of sputtering and vapor deposition. In this case, the metal-resin-containing layer can be formed easily and appropriately, so that the electrode catalyst having a larger surface area per weight of the metal catalyst and an excellent electrode performance can be produced easily.

In the electrode catalyst production method of the invention, it is preferred that a gas diffusion layer is used as the base. In view of preventing quality deterioration of the electrode catalyst or the gas diffusion layer, it is necessary to avoid immersion of the electrode catalyst or the gas diffusion layer in the acid treatment solution. Therefore, in a case where the electrode catalyst is produced by using the immersion treatment in the acid treatment solution, it is difficult to use the gas diffusion layer as the base. In contrast, in the electrode catalyst production method of the present invention, the electrode catalyst can be produced using the gas diffusion layer as the base without the immersion of the gas diffusion layer in the acid treatment solution. Thus, the electrode catalyst can be formed directly on the gas diffusion layer. Therefore, an electrode having the gas diffusion layer and the electrode catalyst can be produced easily and efficiently. Consequently, a fuel cell having the electrode can be produced easily and efficiently.

DESCRIPTION OF EMBODIMENTS

Several preferred embodiments of a porous metal body production method and an electrode catalyst production method according to the present invention will be described in detail below with reference to the accompanying drawings.

Figure 1:
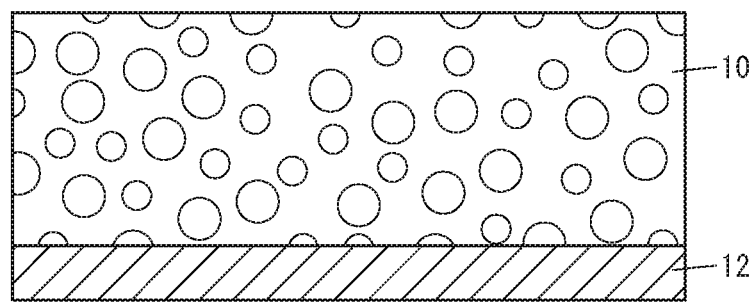
FIG. 1 is a schematic cross-sectional view of a porous metal body (an electrode catalyst) produced by a method according to an embodiment of the present invention.

As shown in FIG. 1, a porous metal body 10 produced by using a method according to an embodiment of the present invention is a porous body of a metal formed on a base 12. Examples of the metals include platinum, palladium, gold, rubidium, titanium, cobalt, nickel, and alloys thereof. The metal is preferably a metal catalyst. The metal catalyst is a metal that can be brought into contact with a fuel gas or an oxygen-containing gas to exhibit a catalyst function for accelerating an electrochemical reaction in a fuel cell (not shown). The metal catalyst may contain platinum, palladium, gold, rubidium, or the like. Thus, in the case of using the metal catalyst as the metal, the porous metal body 10 can be used as an electrode catalyst for the fuel cell.

A material for the base 12 is not particularly limited and may be selected from various materials, as long as the porous metal body 10 can be formed on the base 12 by a process to be hereinafter described. In a case where the porous metal body 10 is produced as the electrode catalyst, the base 12 is preferably a gas diffusion layer. The reason therefor will be described hereinafter. The gas diffusion layer is capable of diffusing the fuel gas or the oxygen-containing gas in the fuel cell. For example, the gas diffusion layer may be a carbon paper or a carbon cloth having a conductive microporous layer (not shown). The gas diffusion layer does not have to have the microporous layer.

Thus, the electrode catalyst production method of this embodiment is one example of the method for producing the porous metal body 10. Therefore, the electrode catalyst production method will be described more specifically below.

Figure 2:
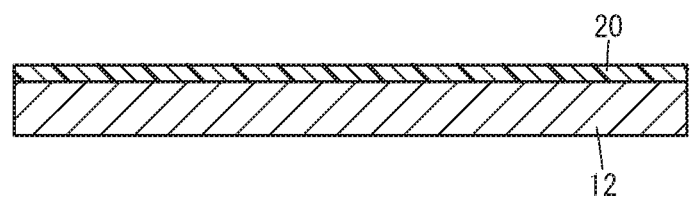
FIG. 2 is a view for illustrating formation of a metal layer on a base (a gas diffusion layer)

First, as shown in FIG. 2, a metal layer 20 containing the metal catalyst is formed on the base 12 of the gas diffusion layer by at least one of sputtering and vapor deposition. In a case where the gas diffusion layer has the microporous layer, the metal layer 20 is formed on the microporous layer.

Figure 3:
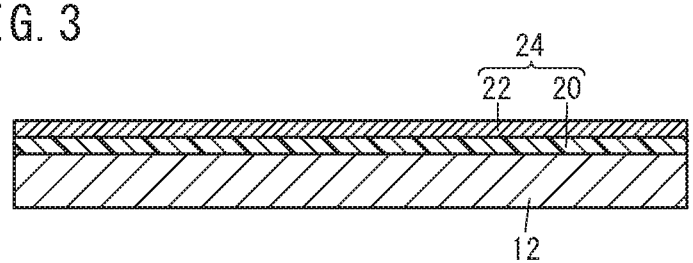
FIG. 3 is a view for illustrating formation of a metal-resin-containing layer by stacking a resin layer on the metal layer of FIG. 2.

Then, as shown in FIG. 3, a resin layer 22 containing a resin is formed on the metal layer 20 by at least one of sputtering and vapor deposition. The resin has a melting point lower than that of the metal catalyst. Preferred examples of such resins include thermoplastic resins such as polypropylenes, polyethylenes, and polyimides. A metal-resin-containing layer 24 containing a stack of the metal layer 20 and the resin layer 22 is formed on the gas diffusion layer in this manner.

Figure 4:
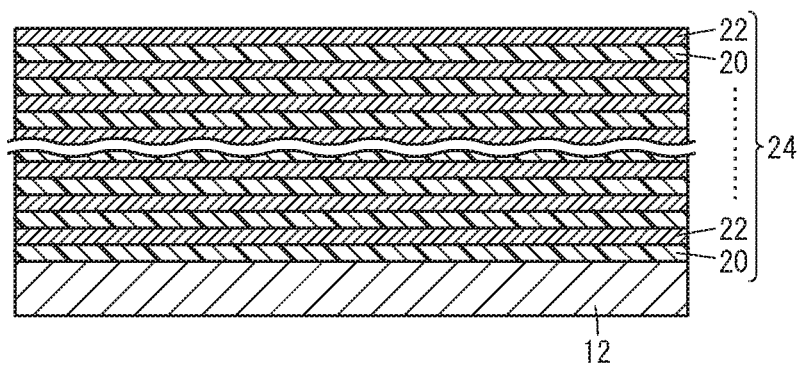
FIG. 4 is a view for illustrating stacking of the metal layers and the resin layers for forming a metal-resin-containing layer having a predetermined thickness.

Then, as shown in FIG. 4, the metal layers 20 and the resin layers 22 are alternately stacked by repeating the layer formation to obtain a predetermined thickness of the metal-resin-containing layer 24.

Next, the metal-resin-containing layer 24 having the predetermined thickness is subjected to a heat treatment. In the heat treatment, the resin may be melted, and particles of the metal may be dispersed in the melted resin. The metal particles are bonded to each other, and the melted resin is decomposed and vaporized, to form the porous electrode catalyst. Therefore, the temperature and time of the heat treatment may be selected in such a manner that the metal layer 20 can be sintered and the resin can be melted and removed due to decomposition or the like from the metal-resin-containing layer 24. Thus, the resin in the metal-resin-containing layer 24 acts as a pore source, so that the metal can be sintered without densification. Then, the resin is removed due to decomposition or the like from the metal-resin-containing layer 24.

Because the resin in the metal-resin-containing layer 24 can act as the pore-forming agent, the resultant porous electrode catalyst has appropriate pores. Furthermore, because the resin can be removed from the metal-resin-containing layer 24 by the heat treatment, the electrode catalyst can be produced without an immersion treatment in an acid treatment solution.

In the above method, the porosity and the pore diameter of the electrode catalyst can be controlled by changing the ratio of the thickness (content) between the metal layers 20 and the resin layers 22 in the metal-resin-containing layer 24. The thickness ratio between the metal layers 20 and the resin layers 22 in the metal-resin-containing layer 24 is preferably controlled in such a manner that the electrode catalyst has a porosity and a pore diameter desirable for achieving an excellent electrode performance. The thickness of the metal-resin-containing layer 24 may be selected in view of obtaining a desired thickness of the electrode catalyst.

As described above, in the method of the present invention, the immersion treatment using the acid treatment solution is not carried out. Therefore, the electrode catalyst can be produced by the simple process easily and efficiently without a step of removing the acid treatment solution from the electrode catalyst, a step of treating the used solution as a waste liquid, etc. Furthermore, as described above, the electrode catalyst has a porous structure with appropriate pores, and a surface area per weight of the metal catalyst can be increased. Therefore, the electrode catalyst requires only a small amount of the metal catalyst to exhibit an excellent electrode performance.

As described above, the method of the present invention does not require the immersion treatment using the acid treatment solution. Therefore, even in the case of using the gas diffusion layer as the base 12, the electrode catalyst can be produced without immersing the gas diffusion layer in the acid treatment solution. Thus, the electrode catalyst can be formed directly on the gas diffusion layer. Consequently, an electrode having the gas diffusion layer and the electrode catalyst can be produced easily and efficiently. Furthermore, a fuel cell having the electrode can be produced easily and efficiently.

In the method for producing the porous metal body 10 of this embodiment, a metal other than the metal catalyst may be used, and a base 12 other than the gas diffusion layer may be used. Thus, the porous metal body 10 having no catalytic activity for a fuel cell may be produced by the method. For example, the porous metal body 10 can be used as a filter, a gas adsorber, etc.

The present invention is not particularly limited to the above embodiment, and various changes and modifications may be made therein without departing from the scope of the invention.

In the above embodiment, the metal layers 20 and the resin layers 22 are formed by at least one of sputtering and vapor deposition. However, the layer formation method is not particularly limited thereto. For example, the metal layer may be formed by mixing the metal with an appropriate solvent to prepare a paste and by applying the paste to the base. Similarly, the resin layer may be formed by applying a paste of the resin to the base.

In the above embodiment, the metal layers 20 and the resin layers 22 are stacked to form the metal-resin-containing layer 24. However, the structure of the metal-resin-containing layer is not particularly limited thereto. The metal-resin-containing layer may have any structure as long as it contains the metal and the resin. For example, the metal and the resin may be mixed with each other in the metal-resin-containing layer, without forming respective layers of the metal and the resin.

EXAMPLES

An electrode catalyst of Example was produced. In the electrode catalyst, a carbon fiber was used for a gas diffusion layer (base), platinum was used as a metal catalyst (metal), and a polypropylene having a melting point of 80° C. was used as a resin.

Specifically, a metal layer having a thickness of 3 nm was formed on the gas diffusion layer by sputtering, and a resin layer having a thickness of 100 nm was formed on the metal layer by vapor deposition, to form a stack of the metal layer and the resin layer. The step of forming the metal layer and the resin layer was repeated ten times, to form a metal-resin-containing layer having a thickness of approximately 1,000 nm. Then, the metal-resin-containing layer was heat-treated at 400° C. for 30 minutes, whereby the metal was sintered and the resin was decomposed and removed. The electrode catalyst of Example was produced on the gas diffusion layer in this manner.

Two gas diffusion layers each having the electrode catalyst of Example were produced. One of the gas diffusion layers was used as an anode, and the other was used as a cathode. The electrode catalyst of the anode was press-bonded to one surface of an electrolyte membrane, and the electrode catalyst of the cathode was press-bonded to the other surface of the electrolyte membrane, to produce an electrolyte membrane-electrode assembly of Example. A fuel cell of Example was produced using the electrolyte membrane-electrode assembly of Example.

Meanwhile, only the metal catalyst was deposited on the gas diffusion layer by sputtering to produce an electrode catalyst of Comparative Example having the same thickness as the electrode catalyst of Example. An electrolyte membrane-electrode assembly of Comparative Example was produced using the electrode catalyst of Comparative Example and the gas diffusion layer, in the same manner as Example. Furthermore, a fuel cell of Comparative Example was produced using the electrolyte membrane-electrode assembly of Comparative Example.

The fuel cells of Example and Comparative Example were each subjected to cyclic voltammogram measurement, and the effective surface areas of the electrode catalysts of Example and Comparative Example were measured. As a result, the electrode catalyst of Example had an effective surface area of 32.9 $m^2/g$, while the electrode catalyst of Comparative Example had an effective surface area of 17.2 $m^2/g$.

The electrode catalyst of Example, which was produced by heat-treating the metal-resin-containing layer containing the resin as a pore-forming agent, had the effective surface area larger than that of the electrode catalyst of Comparative Example, which was produced only by sputtering the metal catalyst. Thus, the electrode catalyst (porous metal body) produced by a production method according to an embodiment of the present invention has appropriate pores, and the surface area per weight of the metal catalyst can be increased effectively in the embodiment.

Figure 5:
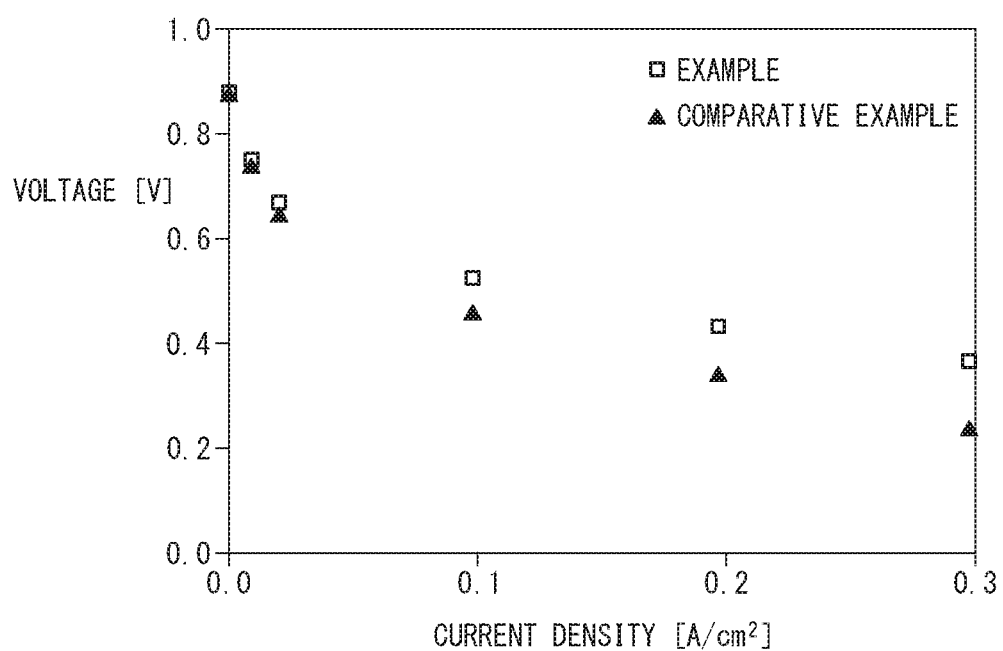
FIG. 5 is a graph showing the relationships between current densities and voltages in fuel cells using electrode catalysts of Example and Comparative Example.

The fuel cells of Example and Comparative Example were each subjected to a power generation test, and the relationships between current densities and voltages were measured. The results are shown in FIG. 5. It is clear from FIG. 5 that voltages in a high current density range were high in the fuel cell of Example, as compared with the fuel cell of Comparative Example. Thus, in the fuel cell of Example, the electrochemical reaction was accelerated more effectively by the electrode catalyst, so that the voltage reduction was suppressed even in the high current density range.

Accordingly, the electrode catalyst produced by the production method of the embodiment has a larger surface area per weight of the metal catalyst, does not contain residual components of an acid treatment solution or the like, and therefore exhibits an excellent electrode performance.

The invention claimed is:

1. A method for producing a porous metal body, comprising the steps of:
   forming a metal-resin-containing layer containing a metal and a resin on a base, a melting point of the resin being lower than that of the metal; and heat-treating the metal-resin-containing layer, thereby sintering the metal and removing the resin from the metal-resin-containing layer, to obtain the porous metal body, wherein in the step of forming the metal-resin-containing layer, a metal layer containing the metal and a resin layer containing the resin are stacked alternately to form the metal-resin-containing layer.

2. The method according to claim 1, wherein in the step of forming the metal-resin-containing layer, the metal-resin-containing layer is formed by at least one of sputtering and vapor deposition.

3. The method according to claim 1, further comprising:
controlling a porosity of the porous metal body by modulating a thickness ratio between the metal layer and the resin layer.

4. A method for producing an electrode catalyst, comprising the steps of:
forming a metal-resin-containing layer containing a metal catalyst and a resin on a base, a melting point of the resin being lower than that of the metal catalyst; and
heat-treating the metal-resin-containing layer, thereby sintering the metal catalyst and removing the resin from the metal-resin-containing layer, to obtain a porous electrode catalyst, wherein in the step of forming the metal-resin-containing layer, a metal layer containing the metal catalyst and a resin layer containing the resin are stacked alternately to form the metal-resin-containing layer.

5. The method according to claim 4, wherein in the step of forming the metal-resin-containing layer, the metal-resin-containing layer is formed by at least one of sputtering and vapor deposition.

6. The method according to claim 4, wherein a gas diffusion layer is used as the base.

7. The method according to claim 4, further comprising:
controlling a porosity of the porous electrode catalyst by modulating a thickness ratio between the metal layer and the resin layer.

* * * * *